United States Patent [19]

Omid-Zohoor

[11] Patent Number: 5,780,353
[45] Date of Patent: Jul. 14, 1998

[54] METHOD OF DOPING TRENCH SIDEWALLS BEFORE TRENCH ETCHING

[75] Inventor: Farrokh Omid-Zohoor, Sunnyvale, Calif.

[73] Assignee: Advanced Micro Devices, Inc., Sunnyvale, Calif.

[21] Appl. No.: 623,636

[22] Filed: Mar. 28, 1996

[51] Int. Cl.[6] .................................. H01L 21/761
[52] U.S. Cl. .................. 438/433; 438/445; 438/524
[58] Field of Search ......................... 437/38, 67, 69, 437/70, 147, 148; 148/DIG. 50; 438/424, 433, 444, 445, 524

[56] References Cited

U.S. PATENT DOCUMENTS

| | | | |
|---|---|---|---|
| 4,534,824 | 8/1985 | Chen | 437/35 |
| 4,905,065 | 2/1990 | Selcuk et al. | 257/301 |
| 5,387,534 | 2/1995 | Prall | 437/44 |
| 5,399,520 | 3/1995 | Jang | 437/67 |
| 5,436,189 | 7/1995 | Beasom | 437/67 |
| 5,445,989 | 8/1995 | Lur et al. | 437/67 |
| 5,445,990 | 8/1995 | Yook et al. | 437/69 |
| 5,457,339 | 10/1995 | Komori et al. | 437/67 |
| 5,459,096 | 10/1995 | Venkatesan et al. | 437/67 |
| 5,460,998 | 10/1995 | Liu | 437/44 |
| 5,466,623 | 11/1995 | Shimize et al. | 437/69 |
| 5,468,675 | 11/1995 | Kaigawa | 437/69 |
| 5,468,676 | 11/1995 | Madan | 437/67 |
| 5,470,783 | 11/1995 | Chiu et al. | 437/67 |
| 5,472,904 | 12/1995 | Figura et al. | 437/67 |
| 5,472,905 | 12/1995 | Paek et al. | 437/69 |
| 5,472,906 | 12/1995 | Shimize et al. | 437/69 |
| 5,473,186 | 12/1995 | Morita | 257/519 |
| 5,474,953 | 12/1995 | Shimizu et al. | 437/67 |

OTHER PUBLICATIONS

Fuse, Genshu; Fukumoto, Masanori; Shinohara, Akihira; Odanaka, Shinji; Sasago, Masaru and Ohzone, Takashi, "A New Isolation Method with Boron-Implanted Sidewalls for Controlling Narrow-Width Effect" IEEE Transactions On Electron Devices, vol. ED-34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED-32, No. 11, Nov. 1985.

*Primary Examiner*—Chandra Chaudhari
*Attorney, Agent, or Firm*—Foley & Lardner

[57] ABSTRACT

Formation of parasitic edge transistors at upper edges of trenches formed on a substrate of an integrated circuit is suppressed by implanting dopants into trench regions of the IC substrate before the trenches are formed in the trench regions by reactive ion etching. The widths of the trenches formed in the trench regions are narrower than the widths of the doped regions of the trench regions. The doped regions of the trench regions are formed by first implanting dopants into the trench regions and then heat treating the implanted regions to activate the dopants and to diffuse the dopants laterally from the implanted regions.

17 Claims, 5 Drawing Sheets

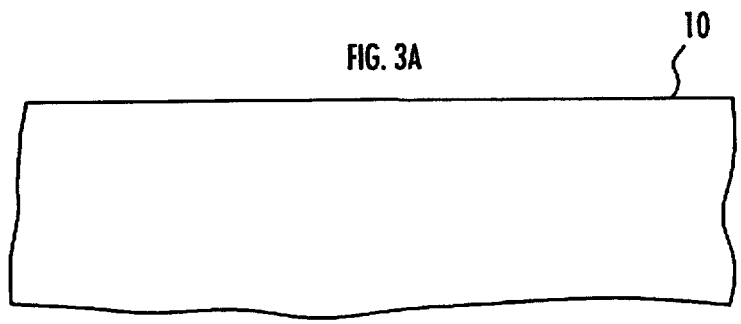
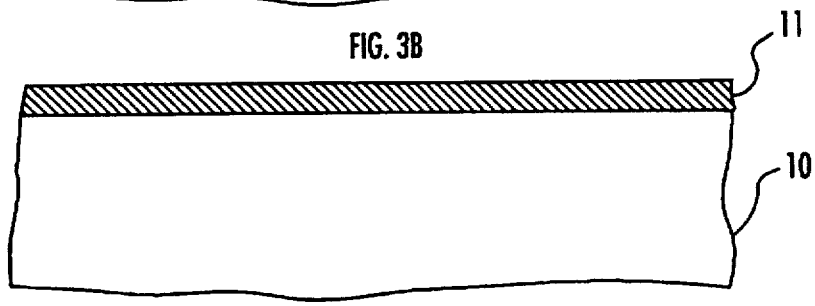
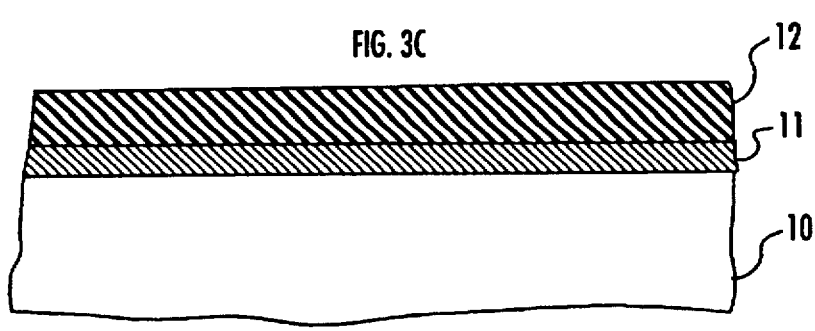
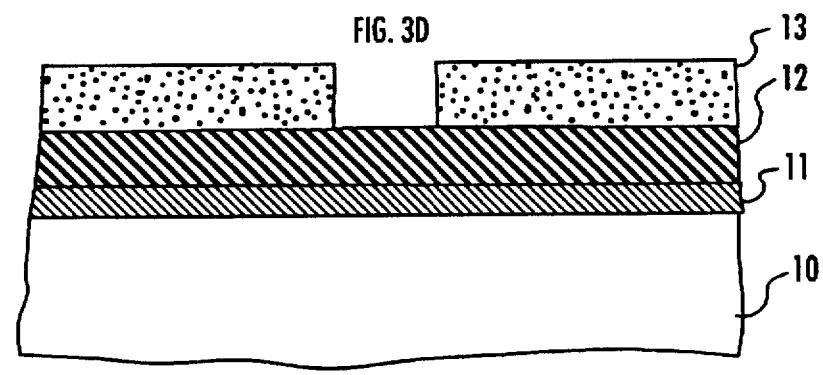
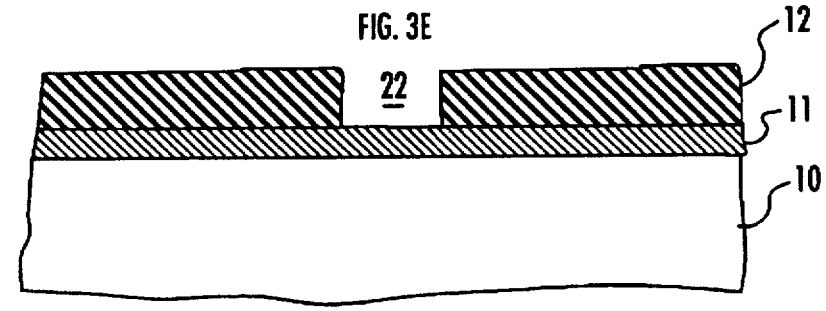

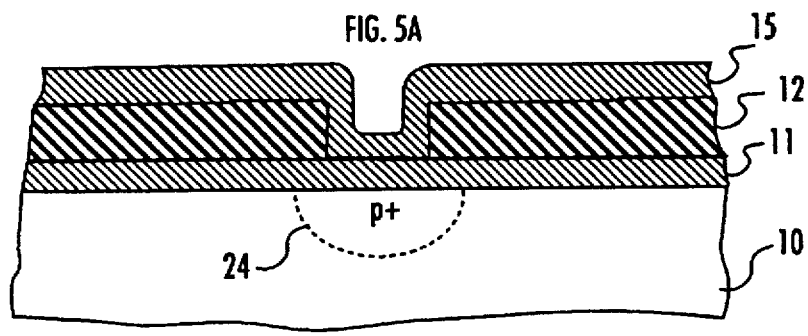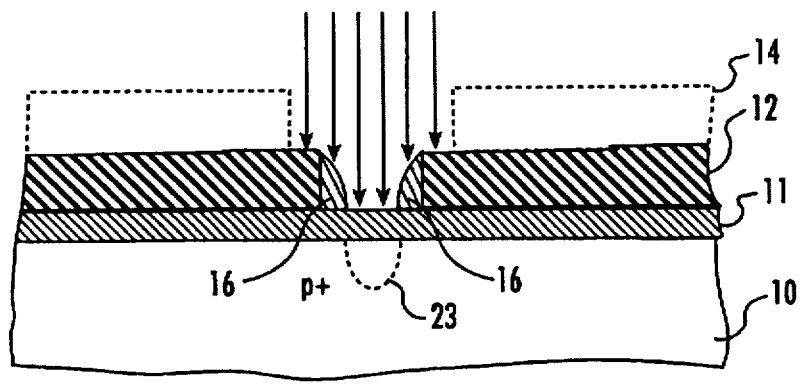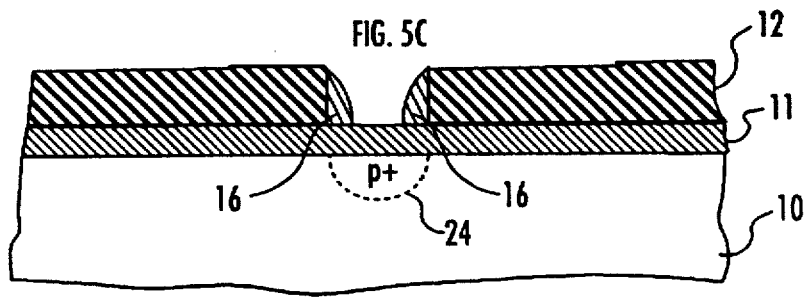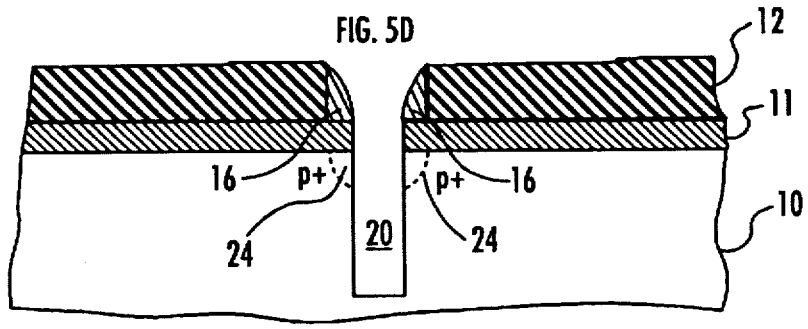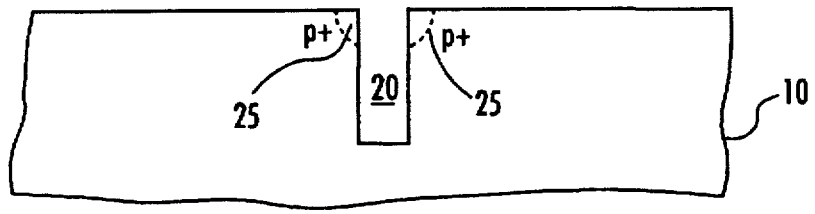

METHOD OF DOPING TRENCH SIDEWALLS BEFORE TRENCH ETCHING

BACKGROUND OF THE INVENTION

1. Field of the Invention

The invention relates generally to an improved method of forming trenches which are used for isolating devices within an integrated circuit (IC) and more particularly to an improved method of doping sidewalls of the trenches to shut off parasitic edge transistors formed at the edges of the sidewalls.

2. Background of the Invention

Various isolation structures for devices within an IC are generally well known in the art. One well known isolation structure is a trench provided in the field region between the devices of the IC. Recently, trench widths have gotten progressively smaller, and, as a result, these devices have become subject to additional leakage paths caused by formation of parasitic edge transistors at upper edges of the trench sidewalls. Parasitic edge transistors are not desired because they increase the OFF current of the devices of the integrated circuit and increase the susceptibility to latchup.

Various methods have been developed to shut off parasitic edge transistors formed at edges of trench sidewalls. One solution to this problem is to dope the sidewall surfaces of the trench. By introducing dopants into the trench sidewalls, the parasitic edge transistors are shut off and the phenomena known as a "subthreshold kink" in the Id versus Vg characteristic curve is suppressed. Additional benefits of introducing dopants in the trench sidewalls include a reduction of the OFF current and the subthreshold slope of the active device formed on the IC.

FIGS. 1A–1C illustrates the prior art method. A trench 20 is etched from a substrate 10 in FIG. 1A. Subsequently, in FIG. 1B, ions 30 are implanted into the upper edges 25 of the trench 20 using a method known as oblique ion implantation. FIG. 1C illustrates the trench 20 after the step of oblique ion implantation.

A disadvantage of the prior art method illustrated in FIGS. 1A–1C is that oblique ion implantation becomes extremely difficult for deep, narrow trenches and for very narrow trenches (width≦0.5 µm) with a high aspect ratio (aspect ratio is defined as the ratio of the height of the trench to its width).

FIGS. 2A–2C illustrate the relative difficulty of implanting ions into trenches with higher aspect ratios. FIG. 2A illustrates the easiest of the three geometries for ion implantation. Ion implantation is more difficult with the geometry of FIG. 2B and the most difficult with the geometry of FIG. 2C. It is well known that the difficulty of ion implantation is a function of the incidence angle α. The larger the incidence angle α, the easier the ion implantation.

In FIGS. 2A–2C, the incidence angle α is dependent on two independent variables—first, the width (or the aspect ratio) of the trenches and second, the thickness of the mask layer ($t_m$, which can be up to 1 µm). FIGS. 2A and 2B illustrate the effect of a reduction in the width (or an increase in the aspect ratio) of the trenches on the incidence angle α. FIGS. 2B and 2C illustrate the effect of an increase in the thickness of the mask layer ($t_m$), known as a shadowing effect, on the incidence angle α.

Another disadvantage of the prior art method is that the angle at which ion implantation is carried out need to be adjusted in accordance with the trench width. Therefore, the wafer on which the IC devices are formed must be tilted so that a desired angle of incidence α is achieved with respect to one sidewall of the trench. Thereafter, the wafer must be rotated by 90° three times, so that each sidewall of the trench can be implanted at the same desired angle of incidence α.

Further, in the prior art method, the trench sidewalls are subjected to heat cycles following ion implantation to activate and diffuse the dopants. As a result, the dopants are diffused laterally and the portion of the active width of the device used for shutting off the parasitic edge transistors becomes larger than necessary.

SUMMARY OF THE INVENTION

An object of the invention is to provide an improved method of doping trench sidewalls for shutting off parasitic edge transistors formed at the upper edges of the trench sidewalls.

Another object of the invention is to provide an improved method of doping sidewalls of very narrow trenches.

Still another object of the invention is to provide a method with which sidewalls of trenches having various widths can be doped at the optimum incidence angle.

Still another object of the invention is to provide a method of doping sidewalls independent of the aspect ratio of the trenches and without the need for tilted angle ion implantation or wafer rotation.

Still another object of the invention is to provide a method of doping trench sidewalls with which the extent of lateral diffusion of doped sidewall regions can be controlled.

The above and other objects of the invention are accomplished by implanting dopants into trench regions of an IC substrate before the trenches are etched in the trench regions. In this method, the widths of the trenches etched in the trench regions are narrower than the widths of the doped regions of the trench regions.

In one preferred embodiment of the invention, the doped regions of the trench regions are formed by implanting dopants into an etched opening of a nitride layer disposed on top of the IC substrate and then heat treating the implanted region to laterally diffuse the dopants into a region which is larger in width than the implanted region. The trenches are formed by reactive ion etching. The remaining layer of nitride is used as an etch mask during the step of trench etching, so the width of each trench is defined by the width of the etched opening of the nitride layer.

In another preferred embodiment of the invention, the doped regions of each trench region are formed by first implanting dopants between a pair of oxide spacers into a predefined region of the IC substrate and then heat treating the predefined region to laterally diffuse the dopants. The trenches are formed by reactive ion etching. The pair of oxide spacers is used as an etch mask during the step of trench etching, so the width of each trench is defined by the width of the opening between the pair of oxide spacers.

Additional objects and advantages of the invention will be set forth in the description which follows. The objects and advantages of the invention may be realized and obtained by means of the instrumentalities and combinations particularly pointed out in the appended claims.

BRIEF DESCRIPTION OF THE DRAWINGS

The invention is described in detail herein with reference to the drawings in which:

FIGS. 3A–3E illustrate the method of preparing an etched opening through a nitride layer disposed on top of an IC substrate.

FIGS. 5A–5E illustrate the method of implanting ions into sidewalls of isolation trenches using the process steps according to a second embodiment of the invention.

DETAILED DESCRIPTION OF THE PREFERRED EMBODIMENT

Figure 1A:
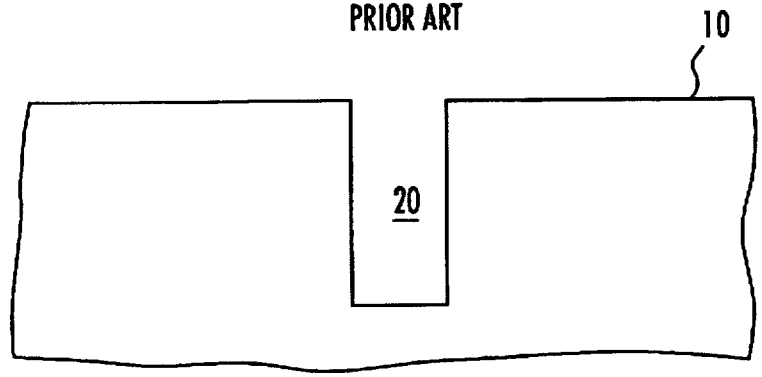
FIGS. 1A–1C illustrate the conventional method of implanting ions into sidewalls of isolation trenches.
Figure 1B:
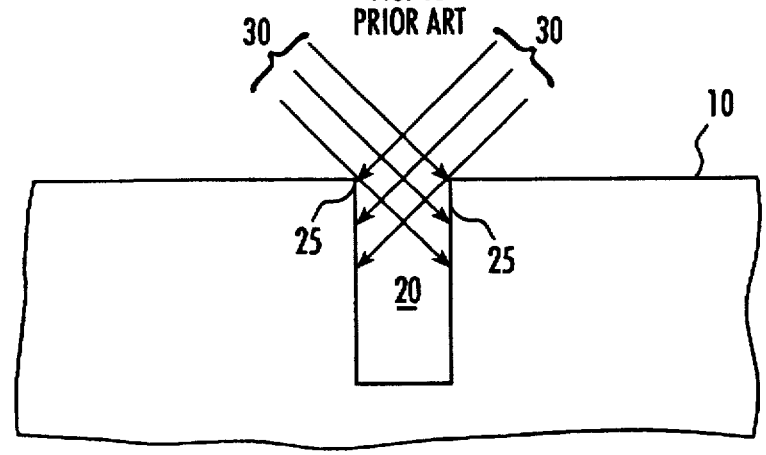
Figure 1C:
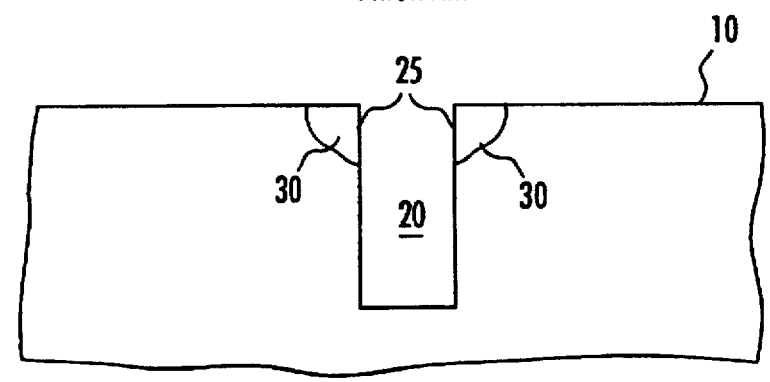
Figure 2A:
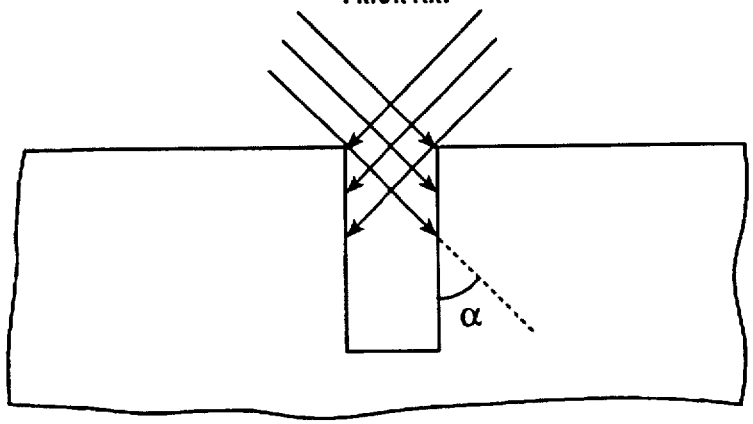
FIGS. 2A–2C illustrate the relative difficulty of the conventional of method of implanting ions into sidewalls of isolation trenches.
Figure 2B:
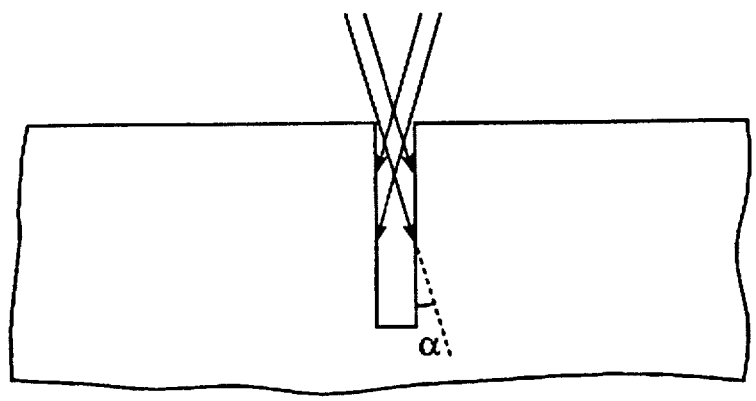
Figure 2C:
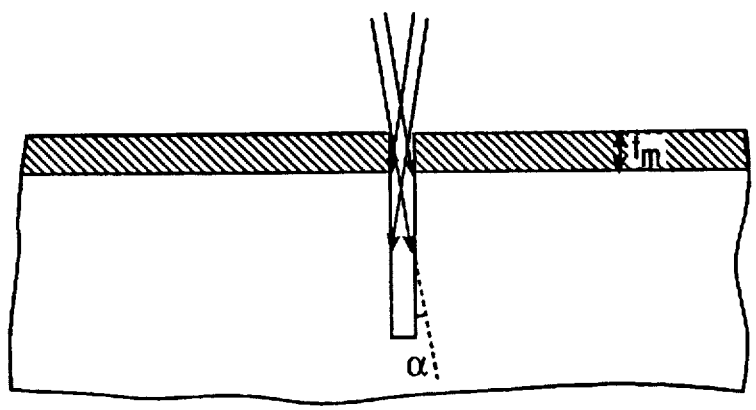

FIGS. 3A–3E illustrate the steps of preparing an etched opening through a nitride layer 12 disposed on top of a substrate 10. These steps are applicable to both the first and second embodiments of the invention.

The substrate 10 is initially provided as shown in FIG. 3A. The substrate 10 is preferably silicon (Si). The surface of the substrate 10 is cleaned, and a 10–60 nm pad oxide layer 11, preferably silicon oxide ($SiO_2$), is thermally grown on the surface of the substrate 10 as shown in FIG. 3B.

Alternative to a silicon oxide layer, a CVD silicon oxide layer may be used in place of the thermally grown silicon oxide layer. An advantage of a CVD silicon oxide layer is that it can be about 25% as thick as a thermal-oxide pad layer, because a CVD silicon oxide layer is more effective in avoiding edge defects. Also, a pad layer containing a thin thermal silicon oxide layer and a buffer polysilicon layer may be used in place of the thermally grown silicon oxide layer.

Next, a 100–200 nm thick layer of CVD silicon nitride ($Si_3N_4$) 12 is deposited on top of the pad oxide layer 11 as shown in FIG. 3C. The function of the pad oxide layer 11, also known as a buffer oxide layer, is to cushion the transition of stresses between the substrate 10 and the nitride layer 12. The nitride layer 12 functions as an oxidation mask. Silicon nitride is effective in this role because oxygen and water vapor diffuse very slowly through it, preventing oxidizing species from reaching the silicon surface under the nitride.

As shown in FIG. 3D, a photo-resist mask layer 13 is deposited on top of the nitride layer 12. The region of the nitride layer 12 exposed through the mask layer 13 is anisotropically dry etched. The etched opening through the nitride layer 12 defines a field region 22 (see FIG. 3E) into which ions are subsequently implanted.

In the first preferred embodiment according to the invention, a photo-resist mask layer 14 is deposited on top of the nitride layer 12 to expose the field regions for which ion implantation is desired. For a complementary metallic oxide semiconductor (CMOS), for example, the mask layer 14 exposes the field regions for n-channel metallic oxide semiconductor (NMOS) processes during ion implantation with, for example, B, $BF_2$ or $BCl_2$ ions, or any combination thereof, and the mask layer 14 exposes the field regions for p-channel metallic oxide semiconductor (PMOS) processes during ion implantation with, for example, P, Sb or As ions, or any combination thereof.

Figure 4A:
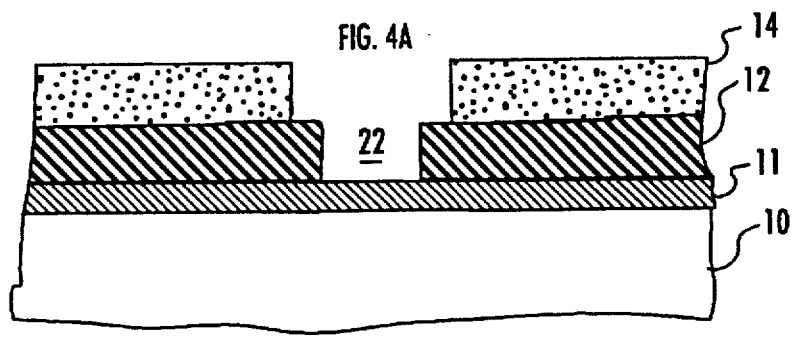
FIGS. 4A–4E illustrate the method of implanting ions into sidewalls of isolation trenches using the process steps according to a first embodiment of the invention.
Figure 4B:
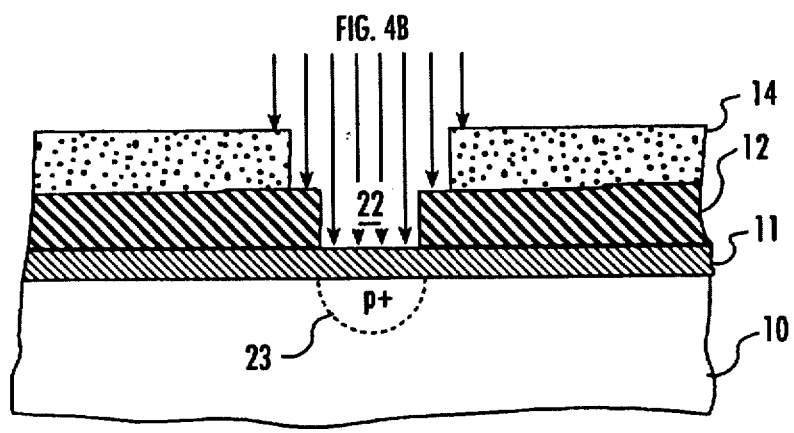

FIGS. 4A and 4B illustrate the case in which ions are implanted into the substrate 10 through the field region 22 to form an implanted region 23 in the substrate 10. The implanted region 23 subsequently undergoes heat treatment (e.g., annealing), and as a result, the dopants diffuse laterally into a doped region 24 which is larger in width than the implanted region 23. The controlled diffusion of the implanted region 23 at this point decreases the amount of diffusion which takes place during subsequent heat cycles and thus allows for better control of the portion of the active width used for the purpose of shutting off parasitic transistors.

Figure 4C:
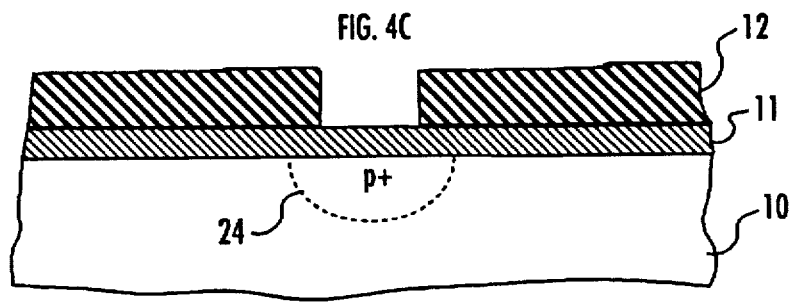
Figure 4D:
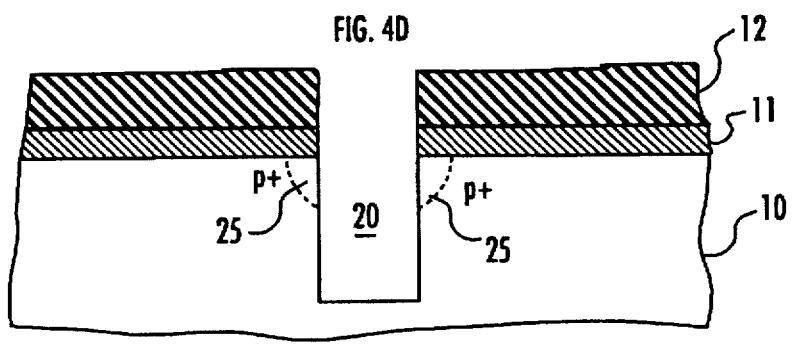
Figure 4E:
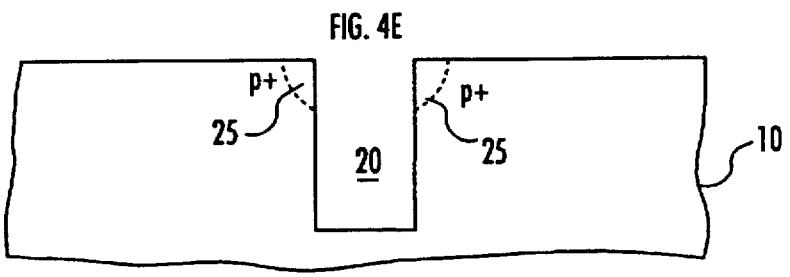

Because the doped region 24, illustrated in FIG. 4C, has a width larger than that of the field region 22, portions 25 of the doped region 24 remain when the substrate 10 is etched to form the trench 20 as shown in FIG. 4D. The trench 20 is formed by reactive ion etching of the substrate 10. The remaining portions of the nitride layer 12 functions as a mask during the reactive ion etching. After the trench formation, the nitride layer 12 and the pad oxide layer 11 are removed to form the device of FIG. 4E.

The second preferred embodiment of the method according to the invention also uses the device illustrated in FIG. 3E. In the second preferred embodiment, a CVD oxide layer 15, shown in FIG. 5A and which can be $SiO_2$ or any other material which has an etch selectivity different from the silicon substrate and silicon nitride, is deposited on the surface of the remaining portions of the nitride layer 12 and an exposed region of the pad oxide layer 11. The CVD oxide layer 15 is etched anisotropically to form a pair of oxide spacers 16.

The bottom width of each oxide spacer 16 is primarily equal to the thickness of the deposited CVD oxide layer 15, as illustrated in FIG. 5B. Therefore, the thickness of the deposited CVD oxide layer 15 is determined by the desired bottom spacing between the oxide spacers 16, which is equal to the desired width of the trench since the oxide spacers 16 function as a mask during the step of trench etching.

Ions are implanted directly into the region between the oxide spacers 16 to form an implanted region 23. Alternatively, a photo-resist mask layer 14 can be deposited on top of the nitride layer 12 to expose only the field regions for which ion implantation is desired. For a complementary metallic oxide semiconductor (CMOS), for example, the mask layer 14 exposes the field regions for negative metallic oxide semiconductor (NMOS) processes during ion implantation with, for example, B, $BF_2$ or $BCl_2$ ions, or any combination thereof, and the mask layer 14 exposes the field regions for positive metallic oxide semiconductor (PMOS) processes during ion implantation with, for example, P, Sb or As ions, or any combination thereof.

The implanted region 23 is subsequently heat treated to drive the dopants laterally into a doped region 24 which has a width larger than that of the implanted region 23. Because the doped region 24, illustrated in FIG. 5C, has a width larger than that of the implanted region 23, portions 25 of the doped region 24 remain when the substrate 10 is etched to form the trench 20 as shown in FIG. 5D. The controlled diffusion of the implanted region 23 at this point decreases the amount of diffusion which takes place during subsequent heat cycles and thus allows for better control of the portion of the active width used for the purpose of shutting off parasitic transistors.

The trench 20 is formed by reactive ion etching of the substrate 10. The remaining portions of the nitride layer 12 and the oxide spacers 16 function as a mask during the reactive ion etching. After the trench formation, the nitride layer 12, the pad oxide layer 11, and the oxide spacers 16 are removed to form the device of FIG. 5E.

In both embodiments, as an alternative to the steps of ion implantation and heat treatment, the upper edges of the trenches, prior to the formation of the trenches, can be doped by diffusion (e.g., by gas or some solid source).

While particular embodiments according to the invention have been illustrated and described above, it will be clear that the invention can take a variety of forms and embodiments within the scope of the appended claims.

What is claimed is:

1. A method of suppressing formation of a parasitic edge transistor at upper edges of an isolation structure formed in a region of a substrate of an integrated circuit, said method comprising the sequential steps of:

depositing a first insulating layer on a semiconductor substrate;

forming at least one opening having sidewalls separated by a width in said first insulating layer;

depositing a second insulating layer of a conformal material on said first insulating layer and in said opening;

anisotropically etching said second insulating layer to form spacers on the sidewalls of said opening and a reduced opening of a lesser width in the first insulating layer;

implanting impurities of the same type as the semiconductor substrate but of higher concentration in the semiconductor substrate through said reduced opening and then annealing to laterally diffuse the impurities under said spacers;

removing a vertical portion of the semiconductor substrate aligned with said reduced opening to form a trench in said substrate of a width of essentially the same width as said lessor width; and filling said trench with a material to form an isolation structure with high concentration impurity regions abutting the upper edges of the trench at and near the surface of the semiconductor substrate.

2. The method of claim 1 wherein, before depositing said first insulating layer, a pad insulating layer is deposited on the semiconductor substrate and the impurities are implanted through the pad layer.

3. The method of claim 2 wherein the pad insulating layer is a composite of thermally grown silicon oxide and polysilicon.

4. The method of claim 2 wherein the pad insulating layer is silicon oxide.

5. The method of claim 4 wherein the silicon oxide is thermally grown.

6. The method of claim 4 wherein the silicon oxide is chemically vapor deposited.

7. The method of claim 1 wherein the first insulating layer is silicon nitride.

8. The method of claim 1 wherein the second insulating layer is silicon oxide.

9. The method of claim 1 wherein the annealing to laterally diffuse the impurities is by heating the semiconductor substrate.

10. The method of claim 1 wherein the removing of the vertical portion of the semiconductor substrate is by anisotropic etching.

11. A method of suppressing formation of a parasitic edge transistor at upper edges of isolation structures formed in regions of a substrate of an integrated circuit, said method comprising the sequential steps of:

depositing a first insulating layer on a semiconductor substrate;

forming a plurality of openings, each having sidewalls separated by a width in said first insulating layer;

depositing a second insulating layer of a conformal material on said first insulating layer and in said openings;

anisotropically etching said second insulating layer to form spacers on each of the sidewalls of said openings and reduced openings of a lesser width in the first insulating layer;

implanting impurities of the same type as the semiconductor substrate but of higher concentration in the semiconductor substrate through said reduced openings and then annealing to laterally diffuse the impurities under said spacers;

removing a vertical portion of the semiconductor substrate aligned with said reduced openings to form trenches in said substrate, each of a width of essentially the same width as said lessor width; and filling said trench with a material to form isolation structures each with high concentration impurity regions abutting the upper edges of the trenches at and near the surface of the semiconductor substrate.

12. The method of claim 11 wherein said isolation structures are used in fabricating a CMOS integrated circuit.

13. The method of claim 11 wherein, before depositing said first insulating layer, a pad insulating layer is deposited on the semiconductor substrate and the impurities are implanted through the pad layer.

14. The method of claim 13 wherein the pad insulating layer is a composite of thermally grown silicon oxide and polysilicon.

15. The method of claim 13 wherein the pad insulating layer is silicon oxide.

16. The method of claim 15 wherein the silicon oxide is thermally grown.

17. The method of claim 15 wherein the silicon oxide is chemically vapor deposited.

* * * * *